United States Patent [19]

Porter et al.

[11] Patent Number: 4,583,808

[45] Date of Patent: Apr. 22, 1986

[54] CONFIGURABLE MULTIPLE CONNECTOR PANEL

[75] Inventors: Warren W. Porter, Escondido; Louis W. Thies, La Jolla, both of Calif.

[73] Assignee: NCR Corporation, Dayton, Ohio

[21] Appl. No.: 708,460

[22] Filed: Mar. 5, 1985

[51] Int. Cl.⁴ ............................................. H01R 13/74
[52] U.S. Cl. ............................ 339/126 R; 339/132 B
[58] Field of Search ........................ 361/346, 426, 429;
339/14 R, 143 R, 22 R, 92 M, 125 R, 126 R, 132 R, 132 B; 248/27.1

[56] References Cited

U.S. PATENT DOCUMENTS

| | | | |
|---|---|---|---|
| 1,930,928 | 10/1933 | Dunlap | 361/429 X |
| 2,538,489 | 1/1951 | Walton | 361/331 X |
| 3,471,029 | 10/1969 | Dolan | 248/27.1 X |

Primary Examiner—Eugene F. Desmond
Attorney, Agent, or Firm—Wilbert Hawk, Jr.; Edward Dugas

[57] ABSTRACT

A back panel particularly adapted for mounting a plurality of electrical connectors of differing size in a grounded and electrically shielded condition. The back panel is formed of a conductive material having parallel openings of fixed length adapted to receive the electrical connectors of interest. A mounting flange affixable to each connector has a width which laps over the opening in the back panel. At least one pair of clamping bars, one for each side of the connector, is provided for holding the mounting flange in rigid electrical contact with the back panel. Plates are provided to fill any openings not filled by connectors and their associated mounting flanges so as to maintain the electrical shielding integrity of the assembly.

6 Claims, 6 Drawing Figures

CONFIGURABLE MULTIPLE CONNECTOR PANEL

BACKGROUND OF THE INVENTION

Certain classes of electronic equipment have an expandable feature which in turn necessitates the use of additional connectors for bringing in signals and additional power. These needs can be filled in a variety of ways, one of which is to build the basic system with all of the possible connectors that can be used fitted onto the system at the time of manufacture. The cost associated with doing this, aside from the efficiencies, make this a highly undersirable option. It is more desirable to have a system wherein the customer can add connectors of the particular type and quantity desired at any time and or rearrange the connectors without the need of special tools and fabrication techniques.

An additional problem arises when the back panel of the electronic equipment has to remain electrically secure from radio frequency emissions, that is, the back panel has to be a shield with no openings through which radio frequency emissions can pass. Furthermore, there is the problem that is associated with grounding in that it is advantageous from an electrical point of view to have the connector and its housing grounded to the potential of the back panel.

A patent of interest for showing the mounting of electrical connectors to panels is represented by U.S. Pat. No. 2,538,489, entitled "Instrument Panel for Accommodating Changeable Arrays of Instruments", by S. A. Walton. The instrument panel disclosed in such patent consists of a metallic frame having parallel rails spaced apart so as to accept electrical components that may be mounted between the rails at desired positions, with each component having a mounting element which assures the positioning of the component between the rails even though there is a difference in size between the electrical components. A mask made of a non-tansparent material, such as plastic, has openings cut therethrough to correspond to the positioning and outline of the electrical components on the panel so as to hide the supporting elements and thereby make a more visually pleasing appearance.

Another patent of interest is U.S. Pat. No. 3,289,043 entitled "Selectable Plug-In Assembly", by E. J. Nielsen. The assembly of this patent is comprised of a plurality of terminal blocks which are each connected to an associated electronic circuit such that a customer may assemble the components and the terminal blocks in a useful configuration and, through push pin connectors insertable into receptacles located in the terminal blocks, cause specific interconnections amongst the electronic components. With the desired interconnections in place, the assembly may be encapsulated to provide a structure which is economical and relatively easy to assemble and manufacture.

Another patent of interest is U.S. Pat. No. 4,131,330, entitled "Mounting Device for Electrical Connectors", by L. J. Stupay. In such patent a mounting device is disclosed for supporting electrical connectors, of an elongated configuration, of a first type, in one portion of the mounting panel and for supporting electrical connectors of a second type in another portion of the panel. Protective wiring covers are provided for shielding the wiring from abrasion and contact with other adjacent members.

A further patent of interest is U.S. Pat. No. 4,353,614, entitled "Unitary Molded Plastic Connector Plug Support Member", by J. O. Etchison, Jr. et al. The invention disclosed in the patent is a molded plastic back plane which has a number of defined elongated openings for receiving like shaped electrical connectors. A feature of the invention is the ability to mount the connectors onto the back plane and have the connectors partially wired at a location differing from where the bay (cabinet9 frames are assembled. The units can then be shipped to a central location where the partially wired back plane can be assembled in the bay fram and the wiring completed.

The aforementioned patents set forth, as an underlying tone, the desirability of flexibility when it comes to wiring and inserting connectors onto back planes of electronic hardware. The inventors of the present invention have directed their efforts towards a versatile system permitting virtually unlimited expansion and combinations by a customer without the need for specialized assembly equipment.

SUMMARY OF THE INVENTION

The connector mounting device of the present invention contains a conductive connector back panel having a plurality of elongated parallel openings for receiving electrical connector bodies. A connector plate adapted to be attached to a connector body is configured to cover the opening over a segment of the elongated opening in a row of the back panel and to position the connector in the opening. A clamping bar adapted to engage the connector plate is positioned and affixed to the back panel using removable fasteners so as to fixedly engage the connector to the back panel while enabling easy removable at a later time. Also provided are conductive plates for inserting into the elongated openings in those areas where connectors are not positioned. Connectors of differing length can be assembled in the longitudinal openings in a manner which will permit all of the opening to be closed by the connectors and their respective connector plates or, if there are openings remaining, a conductive plate, rectangular in shape, may be cut and fitted into the remaining opening to provide a closed structure.

From the foregoing it can be seen that it is a primary object of the present invention to provide a connector panel assembly which is versatile in the configuration of its connectors.

It is another object of the present invention to provide a connector assembly which may be reconfigured without the use of special tools and complicated techniques.

It is yet another object of the present invention to provide a panel assembly which is electrically shielded and grounded.

These and other objects of the present invention will become more apparent when taken in conjunction with the following description and drawings wherein like characters indicate like parts and which drawings form a part of the present application.

DETAILED DESCRIPTION OF THE INVENTION

Figure 1:
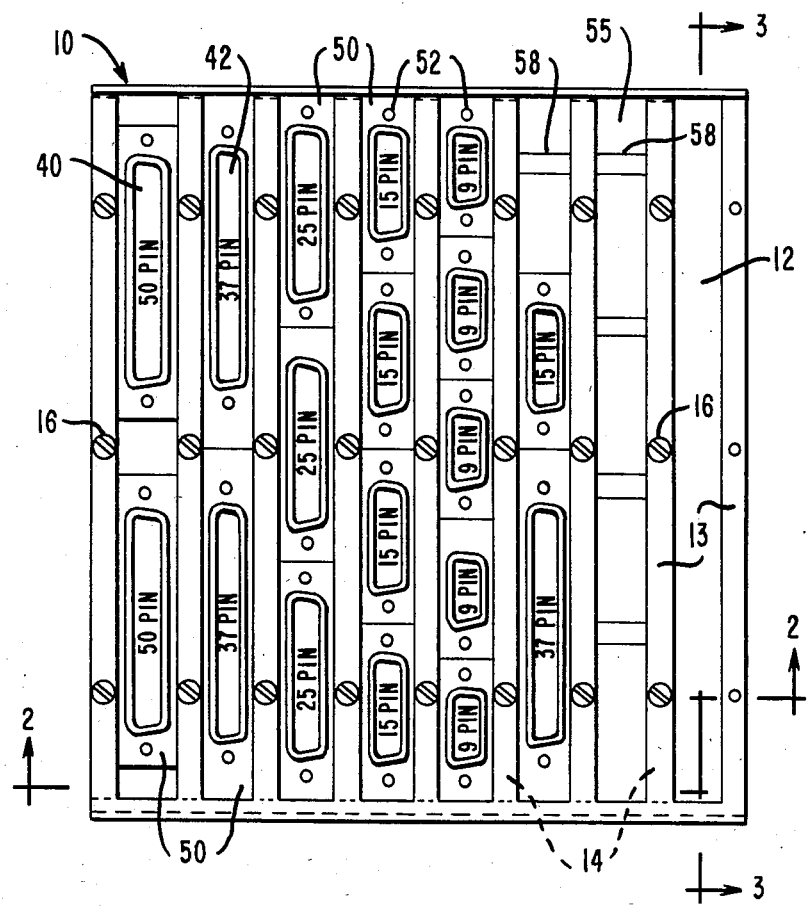
FIG. 1 is a front view of a preferred embodiment of the connector panel with a variety of connectors shown fixed in place.
Figure 2:
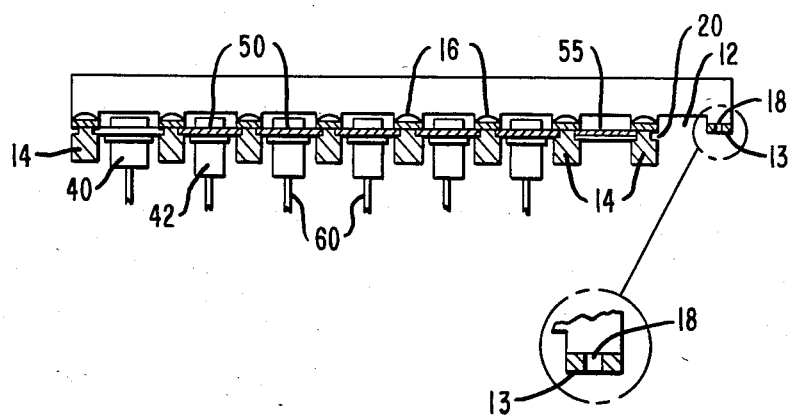
FIG. 2 is a sectioned view taken along the section lines 2—2 of the embodiment shown in FIG. 1.
Figure 3:
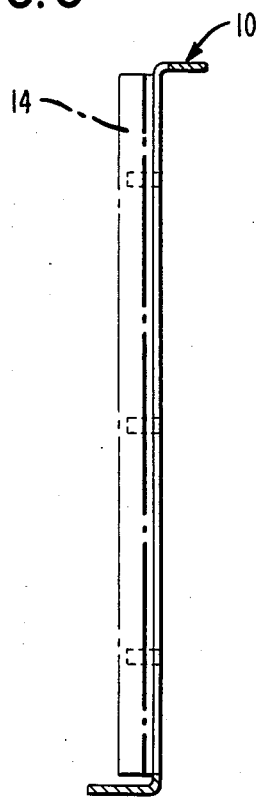
FIG. 3 is a sectioned view of the embodiment shown in FIG. 1 taken along the section lines 3—3.

Referring to FIG. 1 in conjunction with FIGS. 2 and 3, the back panel 10 of the present invention is fabricated from sheet metal having longitudinal openings 12 defined therein. Each opening is separated by a rectangular surface 13. The back panel is configured in height and width to a size which will fill the opening appearing in the back portion of an electrical equipment cabinet. Electrical connectors 42, having differing number of pins but substantially the same physical width, are shown positioned within the longitudinal openings in different configurations. For example, in the fifth row from the left there is shown a 9 pin configuration wherein five such 9 pin connectors are shown positioned so as to fill the longitudinal slot. In a like manner four 15 pin connectors, because of there increased length can accomplish the same filling or utilization of the space. The 25 pin connectors fill the space with only three being insertable. The 37 pin connectors permit two to be inserted into a longitudinal opening. In the sixth row, a 37 pin connector is combined with a 15 pin connector, illustrating the filling of the longitudinal opening with a metal plate 55.

A mounting flange 50 (shown in FIG. 5) is connected to each of the connectors, such mounting flange being of a width slightly greater than the width of the longitudinal openings so that the mounting flange laps on the rectangular surface 13, between the longitudinal openings, preventing the connector from passing through the openings 12 and providing an electrical contact between the connector and the back panel 10. A clamping bar 14, having threaded holes 19 therein (shown in FIG. 4), is dispositioned over the connector plate assembly and is affixed to the back panel by means of fasteners such as screws 16. The clamping bars are formed from conductive material such that they form a continual conductive surface with the connector bodies and the connector plates in conjunction with the conductive back panel. In some instances, for example, with a 50 pin electrical conductor connector identified as element 40 in FIG. 1, the use of a connector flange 50 may not be required. In that instance, the connector may be held in place directly by the use of the clamping bars 14. Any openings along the ends thereof can be filled with segments of metal plate material taken from a filler plate 55, shown in FIG. 6.

Figure 4:
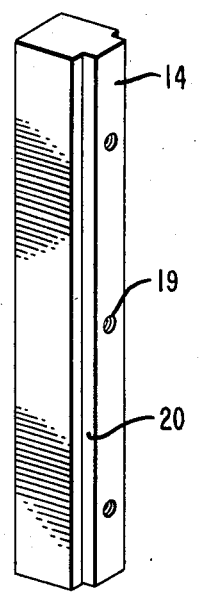
FIG. 4 illustrates in a prospective view a clamping member used in the preferred embodiment of the invention.
Figure 6:
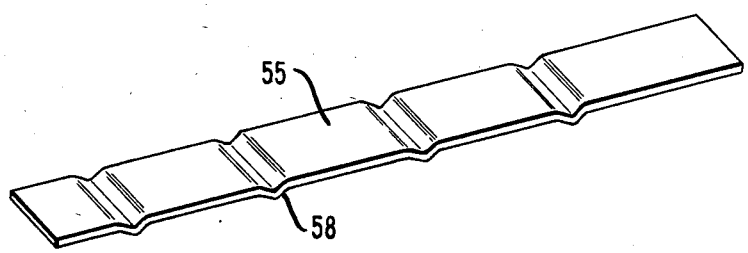
FIG. 6 illustrates in prospective view a metallic plate which may be used as a filler in the panel shown in FIG. 1.

Referring now specifically to FIG. 4, the clamping bar 14, made of conductive material, is shown having a recessed surface 20, milled from each of its opposing sides to receive the mounting flange and/or the blank metal plate 55 (shown in FIG. 6). The clamping bar receives the screws 16 that pass through the screw hole 18 in the back panel rectangular surface 13 to clamp the bar to the back panel 10.

Figure 5:
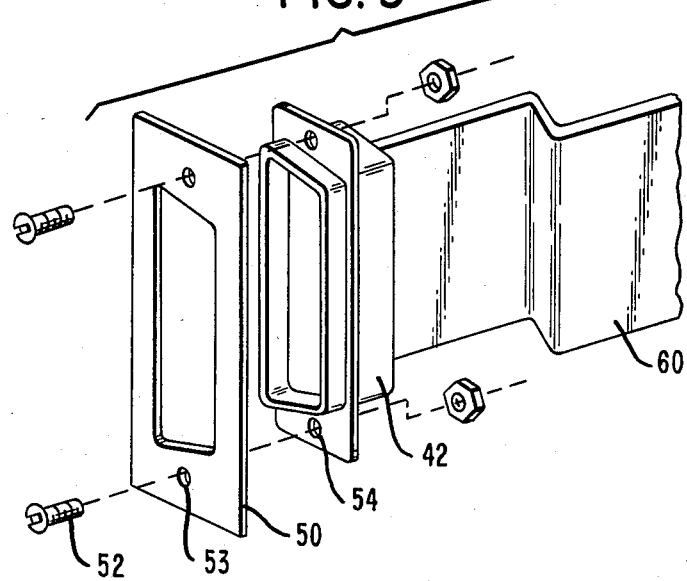
FIG. 5 is an exploded view illustrating the relationship between a connector plate and a connector of the type shown in FIG. 1.

Referring now to FIG. 5, a typical connector 42 is shown connectable to the conductive mounting flange 50, rectangular in shape, and having fastener openings 53, corresponding to openings 54 in the connector body, for receiving fasteners 52 which for example may be a bolt and nut assembly.

FIG. 6 illustrates the metallic plate 55 which is insertable into the opening 12 for electrically closing the opening. The plate has a plurality of transverse dimples 58 which give the relatively thin plate a total displacement thickness equivalent to that normally achieved by the mounting flange 50 so as to provide a contacting thickness between the clamping bar 14 and the back panel 10 such that tightening of the clamping bar into position with the screws 16 will ensure electrical contact between the clamping bar, the dimpled plate and the back panel.

Once the customer has assembled the connectors in the configuration desired, it is obvious that the configuration may be changed by adding additional connectors where desired and/or deleting connectors that are no longer needed.

Fron the foregoing, it can be seen that the invention permits a high degree of versatility in the configuring of a back panel wherein various sizes of connectors may be positioned without the need for specialized tools. In addition, although the disclosure has been directed to connectors of a rectangular configuration, it would be obvious that connectors having, for example either square, round or hexagon, or any other shape can be used by adjusting the openings in the back panel and configuring the mounting flange to fill the openings that would appear between the outline of the connector body and the openings thru the connector panel.

While it has been shown what is considered to be the preferred embodiment of the invention, it will be manifest that many changes and modifications may be made therein without departing from the essential spirit of the invention. It is intended, therefore, in the annexed claims, to cover all such changes and modifications as may fall within the true scope of the invention.

We claim:

1. A multiple connector panel comprising:
   a back panel, formed of electrically conductive material, having a plurality of longitudinal openings defined there thru for receiving electrical connectors;
   a mounting flange adapted for afixing to an electrical connector for permiting said electrical connector to be positioned in a longitudinal opening with the mounting flange abutting said back panel;
   clamping bars having a length corresponding to the longitudinal openings in said back panel, and longitudinal recessed portions extending along opposite sides of said bars for receiving an edge portion of said mounting flange; and
   means for fastening said clamping bars to said back panels adjacent each longitudinal opening to secure mounting flanges to said back panel.

2. The multiple connector panel of claim 1 and further comprising:
   a rectangular conductive blank adapted to close non-used longitudinal openings in said back panel, said rectangular conductive blank adapted to being held in place by said clamping bars.

3. The multiple connector panel of claim 2 wherein said longitudinal conductive blank has a plurality of transverse dimples for increasing the effective thickness of said conductive blank to correspond to the thickness of said mounting flange.

4. The multiple connector panel of claim 1 wherein said mounting flange defines an opening for accepting an elongated electrical connector, said mounting flange having a width greater than that of the longitudinal opening for contacting the surface of the panel on either side of said longitudinal opening and further comprising means for afixing a connector to said mounting flange.

5. A multiple connector panel for changable arrays of electrical conductors comprising:
- a panel having a plurality of rows of longitudinal openings defined there thru for accepting electrical connectors;
- a plurality of mounting flanges each having a central opening for receiving an electrical connector;
- fastener means for affixing said electrical connector to a mounting flange;
- clamping bar means having a length corresponding to the length of the longitudinal openings and a width corresponding to the spacing between adajcent longitudinal openings;
- means for affixing said clamping bar means to said panel adjacent said longitudinal openings for retaining said mounting flanges in abutting contact so as to substantially cover the longitudinal openings; and
- blank plates adapted to fill any longitudinal openings or portions of longitudinal openings not filled by said mounting flanges and said electrical conductors, to electrically close all openings in said panel.

6. The multiple connector panel according to claim 5 wherein each of said blank plates has a plurality of transverse dimples for increasing the effective thickness of said blank plate to correspond to the thickness of said mounting flanges so as to insure electrical contact between said blank plate, panel and electrical connector.

* * * * *